United States Patent [19]
Akhter

[11] Patent Number: 5,441,809
[45] Date of Patent: Aug. 15, 1995

[54] DISSIPATIVE COVER TAPE SURFACE MOUNT DEVICE PACKAGING

[75] Inventor: Sohail Akhter, Brown Deer, Wis.

[73] Assignee: Brady U.S.A., Inc., Milwaukee, Wis.

[21] Appl. No.: 144,650

[22] Filed: Oct. 28, 1993

[51] Int. Cl.6 .............................................. B32B 5/16
[52] U.S. Cl. ................... 428/354; 428/347; 428/349; 428/922; 428/344; 206/613; 53/472; 53/478
[58] Field of Search ............... 257/720, 678, 723, 725; 361/220, 212, 220; 206/328, 334, 328; 428/447, 346, 458, 40; 53/440, 471, 472, 485, 281, 478

[56] References Cited

U.S. PATENT DOCUMENTS

| | | | |
|---|---|---|---|
| 4,590,534 | 5/1986 | Akamatsu et al. | 361/212 |
| 4,971,196 | 11/1990 | Kitamura et al. | 206/328 |
| 5,208,103 | 5/1993 | Miyamoto et al. | 428/354 |

FOREIGN PATENT DOCUMENTS

| | | | |
|---|---|---|---|
| 0422919A2 | 4/1991 | European Pat. Off. | C09J 7/02 |
| 91155383 | 5/1991 | Japan | B65D 73/02 |

Primary Examiner—Rolf Hille
Assistant Examiner—Roy Potter
Attorney, Agent, or Firm—Whyte Hirschboeck Dudek

[57] ABSTRACT

High transparency, low-haze, static dissipative cover tapes for two-piece surface mount device packaging tapes are described comprising a metallized backing film, e.g. a polyester film one side of which is coated with a thin layer of aluminum, and a heat-sealable adhesive, e.g. an adhesive comprising a styrenic block elastomer, a tackifier, a plasticizing agent, an antiblock agent, and a conductive material such as nickel flakes. The cover tapes of this invention can be used with carrier tapes made from either polystyrene or polyvinyl chloride, and demonstrate a consistent peel strength of between 30 and 80 grams.

16 Claims, 1 Drawing Sheet

DISSIPATIVE COVER TAPE SURFACE MOUNT DEVICE PACKAGING

BACKGROUND OF THE INVENTION

This invention relates to surface mount device packaging. In one aspect, the invention relates to a two-piece package for chip-type electronic parts, the package comprising a carrier tape and a cover tape, while in another aspect, the invention relates to a cover tape designed to dissipate static electricity that may be harmful to the electronic packaged parts. In yet another aspect, the invention relates to a heat-sealable, low-haze cover tape.

Surface mount device (SMD) tape is a two-part packaging tape for chip-type electronic parts, e.g. integrated circuits, inductors, transistors, resisters, capacitors, diodes, etc. SMD tape comprises a carrier tape with punched or embossed cavities for holding the part and a cover tape adapted to be heat-sealed to the carrier tape. The carrier tape is typically constructed of polyvinyl chloride, polyester, polypropylene or polystyrene, and the cover tape is typically constructed of polyester to which a heat-sealable adhesive is coated onto one side.

In use, the carrier tape and the cover tape are stored on separate rolls or reels. The carrier tape is unwound from its storage reel and extended in a linear fashion such that parts can be inserted into its cavities. As the parts are inserted, the cover tape is applied along the linear length of the carrier tape such that the adhesive coated side of the cover tape comes into contact with the carrier tape. The cover tape and carrier tape are in contact with one another at their linear edges, and the adhesive on the cover tape is activated (rendered tacky) by the application of heat at those points in which it is in contact with the carrier tape. The heat is provided in a sufficient amount, balanced with an appropriate amount of pressure and dwell time, to activate the adhesive such that a bond of uniform strength is obtained across the length of the SMD tape. The heat and pressure can be applied by any one of a number of different techniques, e.g. hot air guns, drag shoes, ultrasonics, reciprocating sealing shoes, heated pinch rollers, etc. The adhesive carried on the cover tape that is not subjected to the heat and pressure is not activated and as such, it remains nontacky.

SMD tapes must possess a number of certain characteristics if they are to be useful as packages for electronic parts. Since most electronic parts are sensitive to static electricity, SMD tapes are antistatic, static dissipative or conductive so that if any static electricity is generated due to friction from contact between the cover tape and the part, then it is dissipated through the SMD tape. These tapes are also sufficiently transparent to permit any writing (e.g. part numbers, manufacturer's name, etc.) that is borne by most electronic parts to be read through the tape.

Peel strength is another important property of SMD tapes. Peel strength is the force required to remove a cover tape from a carrier tape after the former has been heat-sealed to the latter. If the peel strength is too low, e.g. less than 30 g, then the cover tape can loosen from the carrier tape during packing or shipping and the packaged part can be lost. If the peel strength is too high, e.g. more than 80 g, then the carrier tape can move or "jump" during the unsealing or "detaping" operation and the packaged part either lost or positioned in such a manner that it is not accessible to a robotic arm programmed to remove it from the carrier tape pocket to its assembly point. The peel strength of the SMD tape is the function of a number of different variables including, but not limited to the chemical composition of the adhesive, the method by which the adhesive was activated at the time it was applied to the carrier tape, the conditions to which the SMD tape was subjected from the time of sealing to the time of unsealing, and the amount of time that elapsed between sealing and unsealing.

Another aspect of the cover tape that is important to an effective SMD tape is the nature of the adhesive that is coated onto one of its sides. The adhesive must be activated when exposed to sufficient heat, but remain inactive in the absence of such heat. Moreover, only that portion of the adhesive that is subjected to heat and/or pressure should activate, i.e. the lineal edges of cover tape, such that the adhesive at the center of the tape (and over the packaged part) remains nontacky and does not leave a residue on the packaged part should it come in contact with it. Furthermore, the adhesive should not cause blocking when the cover tape is removed from its storage roll for application onto the carrier tape, and it should be sufficiently clear so as not to haze or otherwise reduce the transparency of the backing film to which it is applied such that writing on the packaged parts is obscured.

Various SMD tapes are commercially available, but all are subject to improvement. Some tapes demonstrate good ability to dissipate static electricity, but the cover tape tends to be hazy. Good dissipation of static electricity generally requires a relatively high loading (more than 30 weight percent) of conductive metal in the adhesive, and this imparts a haze to the optics of the cover tape. Moreover, the backing film of the cover tape is usually metallized, i.e. it is coated with a thin layer of metal on one side to impart electrical conductivity to the cover tape. Some tapes demonstrate relatively good optical properties, but their ability to dissipate static electricity is less than fully desirable. Some of the tapes demonstrate consistent desirable peel strength such that the problems of jumping or slippage are only nominal during an unsealing operation. Moreover, some of the tapes exhibit undesirable blocking properties during removal from the storage reel.

SUMMARY OF THE INVENTION

According to this invention, a transparent, low-haze, static dissipative, heat-sealable cover tape is provided that has a peel force of between about 30 and about 80 grams after heat-sealed to a carrier tape to form a two-piece package for electronic parts. The cover tape comprises:

A. Polymeric film one side of which is coated with a layer of metal such that the metal reduces the transparency of the film by less than about 60 percent, preferably less than 40 percent, and B. Heat-sealable adhesive laminated to the metal-coated side of the film, the adhesive comprising less than 7 weight percent, based upon the weight of the adhesive, of a conductive material such that the conductive material and the metal coating are in contact with one another to form a conductive pathway with a resistivity of less than $10^9$ ohms/square, preferably less than $10^6$ ohms/square.

The cover tapes of this invention can be heat sealed to any conventional carrier tape, and do not block under normal storage and use conditions.

Preferably, the heat-sealable adhesive comprises:
1. A thermoplastic base elastomer comprising one or more styrenic block copolymers,
2. A tackifying agent,
3. A plasticizing agent,
4. An antiblock agent comprising a thermoplastic polymeric microspheres, and
5. A conductive material in the form of flakes, dendrites or filaments.

The conductive material is preferably a metal, such as nickel.

BRIEF DESCRIPTION OF THE DRAWING

The FIGURE is a schematic depiction of a cross-section of one embodiment of a covertape of this invention.

DESCRIPTION OF THE PREFERRED EMBODIMENT

Figure 1:
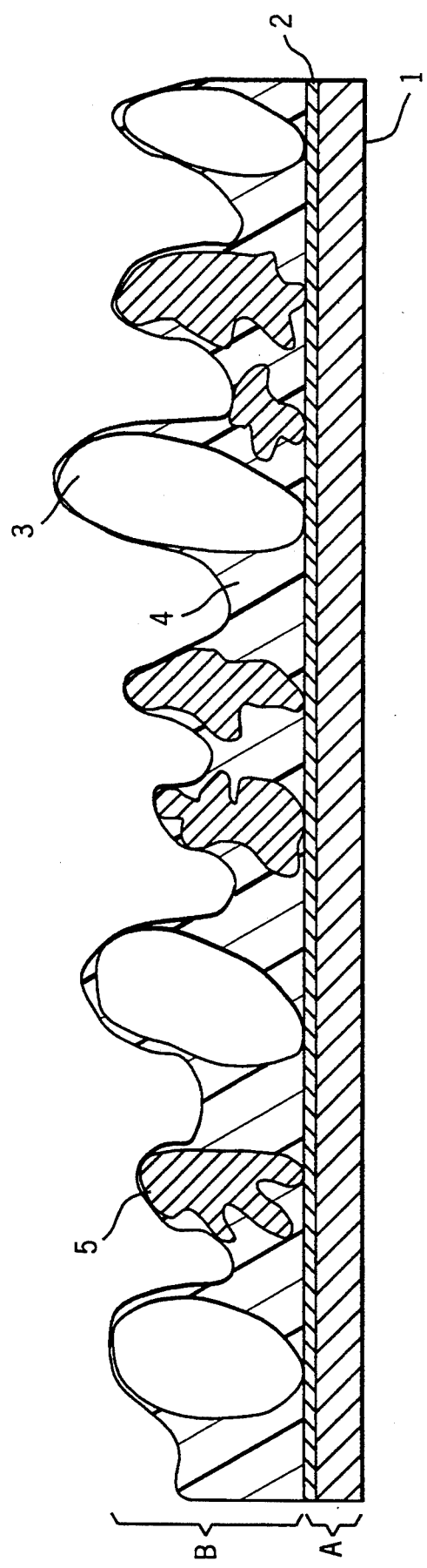

The cover tapes of this invention comprise two basic components, i.e. a backing film and a heat-sealable adhesive. The backing film also comprises two elements, a polymeric film to which a thin metal coating is attached (i.e. bonded) to one side.

The polymeric film can be made of any material that is relatively transparent and exhibits good mechanical strength, e.g. polyester, nylon, polypropylene, etc. These films are typically between 0.5 and 5, preferably between 0.75 and 2 mils in thickness, and they exhibit a high degree of transparency. Films made of polyester, e.g. American Hoechst 2600 polyethylene terephthalate film, are preferred.

The polymeric film is metallized on one side. The metal can be attached to the film by any suitable method, e.g. vacuum evaporation or sputtering, and it is typically applied in an amount such that the transparency of the film is not reduced by more than 60 percent, preferably by not more than 40 percent. The thickness of the metal layer can vary to convenience, and it is primarily a function of the desired resistivity and light transmission properties of the film. Any metal that will conduct electricity can be used as the metallized layer, and aluminum is typical and preferred metal.

Any heat-sealable adhesive that will impart the desired resistivity, transparency, low haze and peel strength properties to the cover tape can be used in the practice of this invention. The heat-sealable adhesive comprises a thermoplastic elastomer comprising one or more styrenic block copolymers, an antiblock agent, and a conductive metal in a finely divided form, preferably in the form of flakes, dendrites or filaments. Preferably, the adhesive also contains a tackifying agent and a plasticizing agent.

Any thermoplastic elastomer comprising one or more styrenic copolymers can be used in the formulation of these heat-sealable adhesives, and the following are illustrative: Kraton G1650, Kraton G1657 and Kraton G1652 (all styrene-ethylene/butylene-styrene block copolymers); Kraton FG1901X and Kraton FG1921X (both maleic anhydride graft-modified styrene-ethylene/butylene-styrene block copolymers); and Kraton D1101 and Kraton D1102 (both styrene-butadiene-styrene block copolymers), all from Shell Chemical Company. Elastomers comprised of a blend of Kraton G1657 and Kraton FG1901X are preferred.

Representative tackifying agents comprising one or more block tackifiers include: Regalrez 1126, Regalrez 1018, Regalrez 1033, Regalrez 1065, Regalrez 1078, Regalrez 1094, Regalrez 3102 and Regalrez 6108 (all agents comprising one or more aliphatic or cycloaliphatic hydrocarbons available from Hercules Inc.); Kristalex 3085, Kristalex 3100, Kristalex 1120, Kristalex 5140, Endex 155 and Endex 160 (all agents comprising one or more aliphatic or cycloaliphatic hydrocarbons in combination with one or more aromatic hydrocarbons, also available from Hercules Inc.); and Nevchem 140 (a crystalline terpene resin available from Neville Chemical Company). Regalrez 1126 is a preferred tackifying agent.

Any material that will facilitate processing and increase the flexibility and toughness of the adhesive can be used as the plasticizer in the heat-sealable adhesive, and typical of these are the nonvolatile organic liquids and low melting solids such as the phthalate, adipate and sebacate esters; polyols such as ethylene glycol and its derivatives; tricresol phosphate; and the like. Mineral oil available from Witco Corporation under the trademark Kaydol is a preferred plasticizer for use in the heat-sealable adhesives used in this invention.

The antiblock agent typically consists of one or more thermoplastic polymeric microspheres of a polyolefin such as an ethylene-vinyl acetate or vinyl chloride copolymer, or a micronized polymer powder of an ethylene-vinyl acetate, fluorocarbon or vinyl chloride type, or a micronized wax or metal oxide fine powder, or ceramic microspheres. The antiblock agent is typically present in an amount of not greater than 50 weight percent based upon the total weight of the adhesive, and preferably not in excess of about 15 weight percent. The particle sizes of the microspheres have an average diameter of less than about 200 microns and preferably less than about 25 microns. The preferred antiblock is vinyl acetate/vinyl chloride copolymer powder available from Occidental Chemical Company under the Oxy trademark.

Any material that will conduct electricity can be used as the conductive material of the heat-sealable adhesive formulation. This material is present in finely divided form, such as a fine powder, flake, dendrite or filament, with flakes, dendrites and filaments preferred over powders, and in an amount sufficient to form a conductive pathway through the adhesive to the metal layer of the backing film to impart a resistivity to the cover tape of less than $10^9$ ohms/square (e.g. $cm^2$, $in.^2$, etc.), preferably less than $10^6$ ohms/square. These materials include conductive mica, tin oxide, copper, aluminum, stainless steel, graphite, silver, tin, nickel and polyaniline at a loading of less than 7 percent, preferably less than 5 percent, and more preferably less than 3 percent, by weight based on the total weight of the adhesive. The particle sizes of the conductive material are typically less than 300 microns, and preferably less than 100 microns. The preferred conductive agents are the nickel dendrites and flakes available from Novamet Company, and mica coated with conductive tin-oxide which is available from the E. I. Du Pont de Nemours Company under the Zelec trademark.

One embodiment of a covertape of this invention is further described by reference to the FIGURE which depicts a covertape in cross-section. Backing sheet A comprises polymeric film 1 to which thin metal coating 2 is attached. Heat-sealable adhesive B is fixed to thin metal coating 2, and heat-sealable adhesive B comprises a plurality of antiblock agent 3 and a plurality of conductive metal 5 embedded in polymeric binder 4. Conductive metal 5 is embedded within polymeric binder 4 in such a manner that at least some of the conductive metal particles are in contact with thin metal coating 2.

The relative amounts of the components of the heat-sealable adhesive can vary with the nature of the cover tape, carrier tape, and the conditions of application and use, but the amounts reported in Table I below are illustrative. All ranges are reported in weight percent based upon the total weight of the formulation.

TABLE i

| HEAT-SEALABLE ADHESIVE FORMULATIONS | | | |
|---|---|---|---|
| Preferred Component | Broad Range | Preferred Range | Most Range |
| Elastomer | 40–80 | 55–75 | 60–70 |
| Tackifier | 0–30 | 5–20 | 10–15 |
| Plasticizer | 0–30 | 5–20 | 10–15 |
| Antiblock | 3–20 | 5–15 | 5–10 |
| Conductor | 0.5–30 | 1–3 | 1–3 |

The heat-sealable adhesive is applied to the metallized surface of the backing film in any convenient manner, e.g. spraying, dipping, roll coating, etc. The adhesive is applied as a very thin layer, e.g. between about 12 and about 50 microns, to the film such that it forms a conductive pathway throughout the tape by which static electricity can be dissipated or conducted. The conductive particles within the adhesive are believed to form a pathway directly to the metal surface of the backing film as opposed to simple particle to particle contact present in most, if not all, commercially available cover tapes (none of which are believed to include a metal surface on the backing layer).

The cover tapes of this invention are used in the same manner as known cover tapes, i.e. they are stored on reels and when needed, are drawn from the reels and heat-sealed to a carrier tape containing parts to be packaged. The cover tapes of this invention do not exhibit blocking when removed from the storage reel, even at temperatures as high as 125° F., and are readily sealed to carrier tapes made from either polystyrene or polyvinyl chloride at temperatures as low as 300° F. The tapes exhibit low haze and high transparency, and the adhesive not activated during the sealing operation remains nontacky even over extended periods of time. Most importantly, the tapes of this invention demonstrate a uniform peel strength of between 30 and 80 grams when sealed and unsealed in a conventional manner.

Conventional conditions for sealing a cover tape (including those of this invention) to a conventional carrier tape (e.g. polystyrene, polyvinyl chloride, etc.) include a temperature of between about 250° and about 450° F., preferably between about 275° and about 400° F.; a pressure of between about 15 and about 60 psi, preferably between about 20 and 50 psi; and a dwell time, i.e. the time over which the cover and carrier tapes are in contact with one another under the sealing temperature and pressure, of between about 0.1 and 1 seconds.

Conventional unsealing or detaping conditions include ambient temperature and pressure, a peel angle between about 90 and 180 degrees, preferably between about 135 and 180 degrees; and a peel speed between about 200 and 400 mm/min, preferably between about 250 and 350 mm/min. Peel strength is conveniently measured on a Systemation TP-150 Peel Strength Analyzer.

As here used, "haze" refers to the light scattering property of the cover tape, low haze films scattering less visible light than high haze films. Low haze films typically scatter less than about 40 percent, preferably less than about 30 percent, of the visible light directed at the film, as measured by a conventional haze measuring instrument. As here used, "transparency" or "light transmission" refers to the light transmission property of the cover tape, i.e. the amount of visible light that passes through a film. The cover tapes of this invention typically transmit at least about 50 percent, preferably at least about 60 percent, of the visible light directed at the film and as measured by a conventional light transmission measuring instrument.

The following example is illustrative of one specific embodiment of this invention. Unless otherwise noted, all parts and percentages are by weight.

SPECIFIC EMBODIMENT

A heat-sealable covertape adhesive was formulated with the following composition:

| Elastomer: | Kraton G1657X (Shell Chemical Co.) | 41.9 |
|---|---|---|
| Elastomer: | Kraton FG1901X (Shell Chemical Co.) | 26.2 |
| Tackifier: | Regalrez 1126 (Hercules Co.) | 12.3 |
| Plasticizer: | Kaydol (Witco Chemical Co.) | 12.3 |
| Antiblock: | Oxy 521 (Occidental Chemical Co.) | 6.3 |
| Conductor: | Nickel LD525 (Novamet Co.) | 2.0 |

The above components were mixed together in toluene solvent at a 25% solids content using a blade mixer. The resulting mixture was then coated onto metallized (aluminum) PET film (American Hoechst 2600) using a drawdown bar of appropriate clearance such that the final dried thickness of the coating would be about 25 microns. The drawn down coating was dried in a 300° F. oven for 3 minutes. The haze, light transmission, resistivity and blocking of the final film were measured as follows:

| Haze: | About 32% as measured by Hazeguard meter XL-211 (manufactured by Byk Gardner) |
|---|---|
| Light transmission: | About 60% as measured by Hazeguard meter XL-211 (manufactured by Byk Gardner) |
| Resistivity: | Between $10^5$ to $10^7$ ohms/square as measured by a three point probe meter model SRM-110 (manufactured by Pinion Corporation) |
| Blocking: | Does not stick to itself or the carrier tape material unless activated by heat. |

To determine the seal/peel properties, the covertape film was slit to a width of 13.3096 mm which was sealed to a carrier tape of 16 mm width. The sealing was done using a Systemation MT-30 sealer (seal pressure of 20 psi and a dwell time of 0.5 seconds). The peeling was done at an degree peel angle and a speed of 300 mm/min using a Systemation TP-150 Tape Peel Analyzer. Table II reports the results for peel forces obtained:

TABLE II

PEEL FORCES

| Carrier tape material | Seal temp (F.) | Peel Force range (gms) |
|---|---|---|
| Polystyrene | 290 | 38–58 |
|  | 300 | 44–65 |
|  | 310 | 47–65 |
|  | 320 | 42–71 |
|  | 330 | 61–79 |
| Polyvinyl chloride | 360 | 32–52 |
|  | 370 | 36–58 |
|  | 380 | 53–77 |
|  | 390 | 63–80 |

Although the invention has been described in considerable detail through the preceding example, this detail is for the purpose of illustration only. Many variations and modifications can be made by one skilled in the art without departing from the spirit and scope of the invention as described in the appended claims.

What is claimed is:

1. A transparent, static dissipative, heat-sealable cover tape with a haze of less than about 40 percent and a peel force of between about 30 and 80 grams after heat-sealed to a carrier tape to form a two-piece package for electronic parts, the cover tape comprising:
    A. A polymeric film, one side of which is coated with a layer of metal such that the metal reduces the transparency of the film by less than about 60 percent, and
    B. A heat-sealable adhesive laminated to the metal-coated side of the film, the adhesive comprising less than 7 weight percent, based upon the weight of the adhesive, of a conductive material such that the conductive material and the metal coating are in contact with one another to form a conductive pathway with a resistivity of less than $10^9$ ohms/square.

2. The covertape of claim 1 with a haze of less than about 30 percent.

3. The covertape of claim 2 in which the polymeric film is a polyester film.

4. The covertape of claim 3 in which the layer of metal on the polyester film is aluminum.

5. The covertape of claim 4 in which the conductive material in the heat-sealable adhesive is selected from the group consisting of conductive mica, tin oxide, copper, aluminum, stainless steel, graphite, silver, tin, nickel and conductive polyaniline.

6. The covertape of claim 5 in which the conductive material comprises less than about 5 weight percent of the heat-sealable adhesive.

7. The covertape of claim 6 in which the conductive material is in the form of at least one of flake, dendrite or filament.

8. The covertape of claim 7 in which the conductive material is nickel.

9. The covertape of claim 8 in which the heat-sealable adhesive further comprises a thermoplastic elastomer of one or more styrenic copolymers, a tackifying agent, a plasticizer, and an antiblock agent.

10. The covertape of claim 9 in which the thermoplastic elastomer of the heat-sealable adhesive is at least one of styrene-ethylene/butylene-styrene or styrene-butadiene-styrene.

11. The covertape of claim 10 in which the tackifying agent comprises at least one of an aliphatic or cycloaliphatic hydrocarbon.

12. The covertape of claim 11 in which the piasticizer is a mineral oil.

13. The covertape of claim 12 in which the antiblock agent is a microsphere of a polyolefin.

14. In a process for packaging an electronic part in a two-piece package comprising a covertape and a carrier tape, the improvement comprising using a covertape comprising:
    A. A polymeric film, one side of which is coated with a layer of metal such that the metal reduces the transparency of the film by less than about 60 percent, and
    B. A heat-sealable adhesive laminated to the metal-coated side of the film, the adhesive comprising less than 7 weight percent, based upon the weight of the adhesive, of a conductive material such that the conductive material and the metal coating are in contact with one another to form a conductive pathway with a resistivity of less than $10^9$ ohms/square.

15. A transparent, static dissipative, heat-sealable cover tape with a haze of less than about 30 percent and a peel force of between about 30 to 80 grams after heat-sealed to a carrier tape to form a two-piece package for electronic parts, the cover tape comprising:
    A. A polyester film, one side of which is coated with a layer of aluminum such that the aluminum reduces the transparency of the film by less than about 60 percent, and
    B. A heat-sealable adhesive laminated to the metal-coated side of the film, the adhesive comprising less than 7 weight percent, based upon the weight of the adhesive, of a conductive material such that the conductive material and the aluminum coating are in contact with one another to form a conductive pathway with a resistivity of less than $10^9$ ohms/square.

16. In a process for packaging an electronic part in a two-piece package comprising a covertape with a haze of less than about 30 percent and a peel force of between about 30 and 80 grams after heat-sealed to a carrier tape, the improvement comprising using a covertape comprising:
    A. A polyester film, one side of which is coated with a layer of aluminum such that the aluminum reduces the transparency of the film by less than about 60 percent, and
    B. A heat-sealable adhesive laminated to the metal-coated side of the film, the adhesive comprising less than 7 weight percent, based on the weight of the adhesive, of a conductive material such that the conductive material and the aluminum coating are in contact with one another to form a conductive pathway with a resistivity of less than $10^9$ ohms/square.

* * * * *